(12) United States Patent
Drane

(10) Patent No.: US 8,381,154 B2
(45) Date of Patent: Feb. 19, 2013

(54) METHOD OF MAKING APPARATUS FOR COMPUTING MULTIPLE SUM OF PRODUCTS

(75) Inventor: Theo Alan Drane, London (GB)

(73) Assignee: Imagination Technologies Limited, Kings Langley, Herts (GB)

( * ) Notice: Subject to any disclaimer, the term of this patent is extended or adjusted under 35 U.S.C. 154(b) by 0 days.

(21) Appl. No.: 13/199,606

(22) Filed: Sep. 2, 2011

(65) Prior Publication Data

US 2012/0059501 A1    Mar. 8, 2012

(30) Foreign Application Priority Data

Sep. 2, 2010    (GB) .................................. 1014609.0

(51) Int. Cl.
*G06F 17/50* (2006.01)
(52) U.S. Cl. ........................................ 716/110; 716/119
(58) Field of Classification Search .................. 716/110, 716/119
See application file for complete search history.

(56) References Cited

U.S. PATENT DOCUMENTS 6,978,427 B1 * 12/2005 Kaviani ..................... 716/117
2004/0025120 A1 * 2/2004 Sako ................................ 716/3

* cited by examiner

*Primary Examiner* — Suresh Memula
(74) *Attorney, Agent, or Firm* — Flynn, Thiel, Boutell & Tanis, P.C.

(57) ABSTRACT

A hardware circuit component for executing multiple sum-of-products operations is manufactured as follows. A set of multiplexed sum-of-products functions of a plurality of operands (a, b, c, . . . ), any one of which functions can be selected in dependence upon a select value (sel) by multiplex operations, is received. The sum-of-products functions are then rearranged in a particular manner. The rearranged set of sum-of-products functions is merged into a single merged sum-of-products function containing one or more multiplexing operations. From this a layout design can be generated, and a hardware circuit component such as an integrated circuit manufactured from the layout design. The step of re-arranging the multiple sum-of-products functions involves aligning the elements of the set of sum-of-products functions in such a manner that the amount of multiplexing in the single merged sum-of-products function is less than in the input set of sum-of-products functions.

10 Claims, 2 Drawing Sheets

$$\min \sum_{r=1}^{k} \sum_{j=0}^{2m-1} (v_r)_j$$

s.t.
$$(v_r)_j \geq (X_r)_{i,j} \quad \forall i$$
$$\sum_{r=1}^{k} X_r = 1_{n,2m}$$
$$(X_p)_{i,j} = (X_q)_{i,j+(-1)^j} \quad \forall i,r,j \quad a_{i,r} = x_p, b_{i,r} = x_q$$
$$e_i^T X_p 1_{2m,1} = 1 \quad \forall i,r \quad a_{i,r} = x_p, b_{i,r} = x_q$$
$$(v_r)_j, (X_r)_{i,j} \in \{0,1\}$$

$$y_1 = \begin{cases} (s=0)? & ab+c: \\ (s=1)? & bc-a: \\ (s=2)? & c-ab: \\ & -a-bc \end{cases}$$

Fig. 1

$$y_1 = \begin{cases} (s=0)? & ab+c: \\ (s=1)? & cb-a: \\ (s=2)? & -ab+c: \\ & -cb-a \end{cases}$$

Fig. 2

$$A = s[0]?c:a$$
$$C = s[0]?a:c$$
$$y_1 = (-1)^{s[1]}Ab + (-1)^{s[0]}C$$
$$= A(b \oplus s[1]) + As[1] + (C \oplus s[0]) + s[0]$$

Fig. 3

$$\begin{aligned} ab+c \\ cb-a &= ca + \bar{a} + 1 \\ -ab+c &= -(ab+\bar{c}+1) = \overline{ab+\bar{c}} \\ -cb-a &= -(cb-a) = \overline{cb+a-1} \end{aligned}$$

Fig. 4

$$y_1 = \begin{array}{ll} (s=0)? & ab+c: \\ (s=1)? & cb+\overline{a}+1: \\ (s=2)? & \overline{\overline{ab+c}}: \\ & \overline{cb+a-1} \end{array}$$

Fig. 5

$$A = s[0]?c:a$$
$$C = (s[0]?a:c) \oplus (s[1] \oplus s[0])$$
$$y_1 = (Ab + C + s[1] \& s[0] - s[1]) \oplus s[1]$$

Fig. 6

$$\min \sum_{r=1}^{k} \sum_{j=0}^{2m-1} (v_r)_j$$

$$\text{s.t.} \quad \begin{array}{ll} (v_r)_j \geq (X_r)_{i,j} & \forall i \\ \sum_{r=1}^{k} X_r = 1_{n,2m} & \\ (X_p)_{i,j} = (X_q)_{i,j+(-1)^{\wedge}j} & \forall i,r,j \quad a_{i,r} = x_p, b_{i,r} = x_q \\ e_i^T X_p 1_{2m,1} = 1 & \forall i,r \quad a_{i,r} = x_p, b_{i,r} = x_q \\ (v_r)_j, (X_r)_{i,j} \in \{0,1\} & \end{array}$$

Fig. 7

METHOD OF MAKING APPARATUS FOR COMPUTING MULTIPLE SUM OF PRODUCTS

BACKGROUND TO THE INVENTION

The invention relates to a method of designing and making hardware circuits, particularly implementable in integrated circuit form, for executing multiple sum-of-products operations, and to circuits made by the method.

Many common operations found within fixed-point Digital Signal Processing (DSP) and Graphics algorithms in integrated circuits can be expressed as a fixed-point sum-of-products (SOP). These include adders, subtractors, multipliers, squarers, multiply-accumulators (MACS), chained additions, decrementors and incrementors, for example. An SOP can be efficiently implemented in hardware, as the partial products for each product can all be summed in parallel.

Previous work has considered improvements to the final carry propagate adder of an SOP, (S. Das and S. P. Khatri, "A timing-driven synthesis approach of a fast four-stage hybrid adder in sum-of-products," in *MWSCAS: 51st Symposium on Circuits and Systems*, August 2008, pp. 507-510). In S. Das and S. P. Khatri's, "An inversion-based synthesis approach for area and power efficient arithmetic sum-of-products," in *VLSID: 21st International Conference on VLSI Design*, January 2008, pp. 653-659, inverted partial product arrays were shown to improve quality of results. Designs implementing operations of the form $\Sigma\ k_i x_i y_i$ where $k_i$ are constants and $x_i$ and $y_i$ are input operands have been considered (D. Kumar and B. Erickson, "Asop: arithmetic sum-of-products generator," in *ICCD: IEEE International Conference on Computer Design: VLSI in Computers and Processors*, October 1994, pp. 522-526). Here multiplication by a constant was performed by using the canonical signed digit recoding and $x_i * y_i$ is computed in redundant carrysave form. Product-of-sum (POS) expressions have also been optimized; (a+b)c, which could be implemented as an addition and multiplier in series, can be expanded to ac+bc, and in fact a whole host of intermediate designs can be created, as demonstrated by S. Das and S. P. Khatri, "A timing-driven synthesis technique for arithmetic product-of-sum expressions," in *VLSID: 21st International Conference on VLSI Design*, January 2008, pp. 635-640, where timing constraints are used to determine which architecture to use. In fact there is a further wealth of design options for POS expressions; they can be incorporated into Booth encoded multipliers in a variety of styles (R. Zimmerman and D. Q. Tran, "Optimized synthesis of sum-of-products," in *37th Asilomar Conference on Signals, Systems and Computers*, vol. 1, November 2003, pp. 867-872).

Despite the existence of efficient implementations of SOP and POS expressions, most datapath synthesis cannot exploit these highly optimal blocks due to non-SOP expressions found within the datapath. Muxing (multiplexing) and shifting found within SOP expressions prevent full and efficient merging. In A. K. Verma and P. Ienne, "Improved use of the carry-save representation for the synthesis of complex arithmetic circuits," in *ICCAD: IEEE/ACM International Conference on Computer Aided Design*, November 2004, pp. 791-798, data flow graphs have been locally manipulated to increase the proportion of the datapath which can be expressed as a single SOP, hence reducing delay and area. For example one of the transformations includes (a+b+c)<<d= (a<<d)+(b<<d)+(c<<d), hence shifters can be moved through summations; a fact exploited more fully by S. Das and S. P. Khatri, "A merged synthesis technique for fast arithmetic blocks involving sum-of-products and shifters," in *VLSID: 21st International Conference on VLSI Design*, January 2008, pp. 572-579.

In terms of considering mutually-exclusive SOP expressions, an example can be found in A. K. Verma and P. Ienne, supra: sel?a+b:c=(sel?a:c)+(sel?b:0). However such optimizations were restricted to localized regions. A fuller consideration of merging mutually-exclusive operations can be found in S. Das and S. P. Khatri's "Area-reducing sharing of mutually exclusive multiplier, mac, adder and subtractor blocks," in *IASTED: 5th International Conference on Circuits, Signals and Systems*, July 2007, pp. 269-272 and "Resource sharing among mutually exclusive sum-of-product blocks for area reduction," *TODAES: ACM Transactions on Design Automation of Electronic Systems*, vol. 13, no. 3, pp. 51-57, July 2008. In this instance the SOP is split into partial generation, array reduction and final carry propagate adder with muxing on inputs to each of these units.

SUMMARY OF THE INVENTION

The invention in its various aspects is defined in the independent claims below to which reference may now be made. Advantageous features of the invention are set forth in the appendent claims.

Examples of the invention are described in detail below with reference to the drawings. These examples take a set of mutually-exclusive SOPs (i.e. SOPs where one of a plurality of possible polynomials is selected) and derive an equivalent single SOP. This is preferably done with minimal control by means of the construction of a binary linear program (BLP). The examples also preferably utilize a novel approach to producing negative terms within an SOP.

In particular, in the examples a hardware circuit component for executing multiple sum-of-products operations is manufactured as follows. A set of multiplexed sum-of-products functions of a plurality of operands (a, b, c, . . . ), any one of which functions can be selected in dependence upon a select value (sel) by multiplex operations, is received. The sum-of-products functions are then rearranged in a particular manner. The rearranged set of sum-of-products functions is merged into a single merged sum-of-products function containing one or more multiplexing operations. From this a layout design can be generated, and a hardware circuit component such as an integrated circuit manufactured from the layout design. The step of re-arranging the multiple sum-of-products functions comprises aligning the elements of the set of sum-of-products functions in such a manner that the amount of multiplexing in the single merged sum-of-products function is less than in the input set of sum-of-products functions. Additionally, negative terms in the sum-of-products functions are selectively negated so that particular products are always positive.

Mutually-exclusive SOPs occur naturally when multiplying sign/magnitude numbers, and so arise within floating-point modules, e.g. multiply, accumulate, dp2, dp3 etc. The present invention departs notably from previous proposals for SOP implementation, and moreover can be viewed as a register transfer level to register transfer level (RTL to RTL) transformation which can fit into a synthesis flow for the preparation of an integrated circuit.

BRIEF DESCRIPTION OF THE DRAWINGS

The invention will now be described in more detail by way of example with reference to the drawings, in which:

FIGS. 1 to 7 show equations illustrative of the preferred method embodying the invention, in particular:

FIG. 1 shows sample mutually-exclusive SOPs;

FIG. 2 shows the sample SOPs when reordered;

FIG. 3 shows the SOPs after having being merged in a first form;

FIG. 4 shows the SOPs rewritten to accommodate negation;

FIG. 5 illustrates the rewritten SOPs in a form similar to FIG. 2;

FIG. 6 shows the merged SOPs after optimisation with respect to sign;

FIG. 7 shows a Binary Linear Program that can be used to effect the final optimisation.

DETAILED DESCRIPTION OF PREFERRED EXAMPLES OF THE INVENTION

Brief summary

A brief summary is first given. In order to illustrate a method embodying the invention we consider a simple mutually-exclusive set of SOPs, see the pseudo code in FIG. 1. FIG. 1 shows an output $y_1$ which can take four values dependent on a select signal s. The four values each contain two terms and are ab+c, bc−a and c−ab, for s equals 0, 1 and 2 respectively, and −a−bc for any other value of s. For a small design we seek to reformulate the equations such that only one SOP is required, or at least the number of SOPs is reduced. The first step in doing this is to reorder the multiplications and additions in such a way as to reduce and preferably to minimize the amount of muxing (multiplexing) between operands once merged. In this case we produce FIG. 2 by writing each SOP in the form AB+C and choosing the order of A and B such that one term, in this case the second term, in the multiplication is always b. That is, at least one operand is lined up so as to be in the same position on a plurality, preferably all, of the SOPs. Also the number of operands in each term is made uniform or as uniform as possible.

As shown in FIG. 3 the SOPs are merged together. This is done while noting that if we use the standard two's complement identity $-x=\bar{x}+1$, then $(-1)^s\, a = a \oplus s + s$, where $a \oplus s$ is a signed number one bit larger than a where each bit of a is 'XOR'ed with the bit s. (The plus-in-a-circle sign ⊕ indicates an Exclusive-OR operation as is conventional.)

We had to optionally negate the product in FIG. 3, but the product is the most delay and area expensive part of the SOP. To minimise this cost we wish preferably to minimise the logic that provides inputs to it; hence it would be advantageous to rewrite the SOPs such that the largest product is always positive. To do this we consider replacing x with x−1 in the formula $-x=\bar{x}+1$ and simplifying to get $-x=\overline{x-1}$.

Thus we have two ways to perform negation. We can replace −a with $\bar{a}+1$, or we can replace it with $\overline{a-1}$, and similarly for the other operands. We can exploit this freedom to rewrite each SOP such that the product is always positive, see FIG. 4. Inserting these back into the formula for $y_1$ shown in FIG. 2 results in FIG. 5. In this case the merging now results in FIG. 6 (the & sign in FIG. 6 indicates an AND gate function).

FIG. 6 is an improvement on FIG. 3 because FIG. 3 has more and larger addends than FIG. 6, moreover FIG. 6 adds little in the way of extra hardware over ab+c, in particular the functions A and C are relatively simple to generate; hence this is a desirable form to aim for when implementing mutually-exclusive SOPs.

In order to implement the invention a set of SOPs will be received, for which it is desired to manufacture an integrated circuit component which will provide processing in accordance with the set of SOPs. The first phase of the method is to design an integrated circuit layout which effectively will implement the SOPs. Most of the discussion in this specification is concerned with this phase, and in particular with transforming the input set of SOPs into a single equivalent SOP. The second phase in the manufacture is to generate a layout design to execute the single SOP obtained in the first phase. The third and final phase of the manufacturing method is to take the thus-generated layout design and to manufacture an integrated circuit in accordance with the design. The second and third steps are not described in any detail at all in this specification as they can be effected entirely using techniques and equipment that are standard in the art of integrated circuit manufacture. Finally, an integrated circuit embodying the invention will thus be obtained.

Detailed Method

The first phase of the method, viz. the design of the integrated circuit layout, will now be described in detail. The method deals with a mutually-exclusive sum of fixed-point products, i.e. a sum of products where one of a plurality of possible polynomials is selected. Say the function has k inputs $x_1, x_2 \ldots x_k$ all of which are fixed-point numbers (these k values, which are shown in FIGS. 1-6 by the operands a, b, c, . . . , are referred to below as 'the alphabet'). The function chooses between n different sums of products $f_0, f_1 \ldots f_{n-1}$. Each sum of products has m terms and each term can be negative or positive.

Following the example of the illustrative sample set of SOPs of FIGS. 1-6 we can now formalize this process. In light of these restrictions we may write our intended function as:

$$f_i(x_i) = \sum_{r=0}^{m-1} a_{i,r} b_{i,r} (-1)^{\wedge s_{i,r}} \text{ for } \begin{cases} i = 0 \ldots n-1 \\ s_{i,r} \in \{0, 1\} \\ a_{i,r} b_{i,r} \in \{x_1, x_2 \ldots x_k\} \end{cases}$$

$$y = mux((f_1, f_2 \ldots f_{n-1} f_n), sel)$$

where $$mux((a_0, a_1, \ldots, a_{n-1}), sel) = (sel = 0)?a_0: (sel = 1)?a_1: \ldots$$

Here sel selects/muxes between n SOPs, each with m products and where the operands are drawn from the alphabet of k elements. The method relates to how this function is transformed into a single sum of products. (Note that in the above equation and elsewhere below, the designation sel corresponds to the s used in FIGS. 1-6 as indicating the select operation. The symbol ∈ designates 'included in' in conventional fashion.)

The method seeks to transform the original expression into the following form:

$$a_r = mux(\{x_1, x_2, \ldots, x_k\}, g1_r(sel))\ r \in \{0, 1, \ldots, m-1\} \qquad (1)$$

$$b_r = mux(\{x_1, x_2, \ldots, x_k\}, g2_r(sel))\ r \in \{0, 1, \ldots, m-1\}$$

$$y = (-1)^{g4(sel)} \sum_{r=0}^{m-1} a_r b_r (-1)^{\wedge g3_r(sel)}$$

$$y = \left(\left(\sum_{r=0}^{m-1} b_r(a_r \oplus g3_r(sel)) + b_r g3_r(sel)\right) - g4(sel)\right) \oplus g4(sel)$$

This form is a generalization of the functional form shown in FIG. 6. In particular we seek transformations such that the functions $g1_r$ and $g2_r$ are 'minimal', a criterion that is clearly defined in Part I, below, of the method. There is freedom in choosing $g3_r$ and $g4$; in the illustrative SOPs of FIGS. 1-6 this freedom was chosen to keep the largest product positive.

For ease of explanation the following simplifying assumptions will be initially made, and then the changes needed where they are not true described in the section below headed Alternative Implementations.

A) Each SOP has the same number of terms.
B) Operands are unsigned, non-constant and of identical word length.
C) Operands within each of the mutually-exclusive SOPs are all distinct.

Given all inputs are of equal word length, there is in this example no largest product, so it will be assumed that we make the first product positive.

Following the structure of the optimization of the illustrative SOPs of FIGS. 1-6, the method seeks to formalize the process by which FIG. 1 is transformed into FIG. 2 (Part I of the method) and then perform the subsequent transformations (Part II of the method).

Part I of the Method

The first step is to minimize the operand muxing (multiplexing). To facilitate this process consider the n by 2m matrix:

$$\Gamma = \begin{pmatrix} a_{0,0} & b_{0,0} & a_{0,1} & b_{0,1} & \cdots & a_{0,m-1} & b_{0,m-1} \\ a_{1,0} & b_{1,0} & a_{1,1} & b_{1,1} & \cdots & a_{1,m-1} & b_{1,m-1} \\ \vdots & \vdots & \vdots & \vdots & \ddots & \vdots & \vdots \\ a_{n-1,0} & b_{n-1,0} & a_{n-1,1} & b_{n-1,1} & \cdots & a_{n-1,m-1} & b_{n-1,m-1} \end{pmatrix}$$

In order the use the illustrative SOPs in FIG. 1, we introduce a new variable, which we treat as having the same word length as a, b and c but whose value is always 1. This is used so that each term of each SOP has the same number of operands, i.e. two. This enables us to adhere to the simplifying assumptions A, B and C defined above. So in this case n=4, m=2, k=4 and our alphabet is the set (a, b, c, 1). Hence $\Gamma$ can be written as:

$$\Gamma = \begin{pmatrix} a & b & c & 1 \\ b & c & a & 1 \\ c & 1 & a & b \\ a & 1 & b & c \end{pmatrix}$$

Now decompose $\Gamma$ into k binary matrices $X_r$ corresponding to the alphabet present, each matrix having a one to indicate the presence of an operand and a zero to indicate its absence, such that:

$$\Gamma = \sum_{r=1}^{k} x_r X_r$$

So in the case of the illustrative SOPs, this decomposition becomes:

$$\Gamma = \quad (2)$$

$$a\begin{pmatrix} 1 & 0 & 0 & 0 \\ 0 & 0 & 1 & 0 \\ 0 & 0 & 1 & 0 \\ 1 & 0 & 0 & 0 \end{pmatrix} + b\begin{pmatrix} 0 & 1 & 0 & 0 \\ 1 & 0 & 0 & 0 \\ 0 & 0 & 0 & 1 \\ 0 & 0 & 1 & 0 \end{pmatrix} + c\begin{pmatrix} 0 & 0 & 1 & 0 \\ 0 & 1 & 0 & 0 \\ 1 & 0 & 0 & 0 \\ 0 & 0 & 0 & 1 \end{pmatrix} + 1\begin{pmatrix} 0 & 0 & 0 & 1 \\ 0 & 0 & 0 & 1 \\ 0 & 1 & 0 & 0 \\ 0 & 1 & 0 & 0 \end{pmatrix}$$

As is seen, each of these four individual matrices $X_r$ shows where the corresponding operand appears in the single matrix above. Given this decomposition, we can view transformations of the SOPs as simply manipulating the binary matrices $X_r$. For $X_r$ to still represent the original polynomial, certain conditions must be satisfied. To simplify the following matrix equations we introduce some useful notation. Let $\mathbf{1}_{n1,n2}$ represent an n1 by n2 matrix entirely consisting of ones, and $e_i$ represent the ith standard basis vector, i.e. a vector with one in position i and zero elsewhere. Now our first condition is that $X_r$ must still represent n SOPs of m products, hence:

$$\sum_{r=1}^{k} X_r = \mathbf{1}_{n,2m} \quad (3)$$

Note that this constitutes 2 nm constraints. Secondly, consider that the product $x_p x_q$ is found within the fth SOP. Then we are free to write this product in 2m ways; i.e. once the $x_p$ is chosen, the $x_q$ location is fixed. This corresponds to the following restriction on $X_r$:

$$(X_p)_{i,j} = (X_q)_{i,j+(-1)^j} \forall j \in \{0,1,\ldots,2m-1\} \quad (4)$$

(The inverted-A symbol $\forall$ designates 'for all' in conventional fashion.) Note that this constitutes a total of 2 $nm^2$ constraints and only holds provided that each operand is distinct within each SOP. However these constraints only check that each product is kept together, one further constraint is required to check that the product exists within the SOP. Given that the product $x_p x_p$ is found within the ith SOP, it is sufficient to check that there is a 1 within the fth row of matrix $X_P$:

$$e_i^T X_p \mathbf{1}_{2m,1} = 1 \quad (5)$$

Note that there are nm such constraints. We are now free to choose $X_r$ as long as the mn(3+2m) constraints presented in equations (3), (4) and (5) hold, as the result can still be interpreted as a valid transformation of the original set of SOPs. Referring again to the illustrative SOP, we performed the following transformation between FIGS. 1 and 2:

$$\Gamma = \begin{pmatrix} a & b & c & 1 \\ b & c & a & 1 \\ c & 1 & a & b \\ a & 1 & b & c \end{pmatrix} \Rightarrow \Gamma' = \begin{pmatrix} a & b & c & 1 \\ c & b & a & 1 \\ a & b & c & 1 \\ c & b & a & 1 \end{pmatrix} \quad (6)$$

We can give a metric to the reduction in muxing of the final SOP by this transformation. Pre-transform, operand a was involved in muxing in 2 locations, b in 4, c in 4 and 1 in 2. Post-transform operand a was involved in muxing in 2 locations, b in 1, c in 2 and 1 in 1. For a measure of the muxing cost we can sum the total number of times an operand is required within the muxing, in this case we have reduced this total from 12 to 6. In general the muxing cost can be captured by:

$$\sum_{r=1}^{k} \sum_{j=0}^{2m-1} \bigvee_{i=0}^{n-1} (X_r)_{i,j} \quad (7)$$

This is the sum of the result of 'OR'ing each column of the k matrices $X_r$. We can now state the optimization that will minimize the amount of final SOP muxing:

$$\min \sum_{r=1}^{k} \sum_{j=0}^{2m-1} \bigvee_{i=0}^{n-1} (X_r)_{i,j}$$

$$\sum_{r=1}^{k} X_r = 1_{n,2m}$$

s.t. $(X_p)_{i,j} = (X_q)_{i,j+(-1)^j}$  $\forall\, i, r, j$  $a_{i,r} = x_p, b_{i,r} = x_q$ $e_i^T X_p 1_{2m,1} = 1$  $\forall\, i, r$  $a_{i,r} = x_p, b_{i,r} = x_q$ (The designation 's.t.' means 'subject to' in conventional fashion.) By introducing 2mk variables encapsulated by k vectors $v_r$ of length 2 m, we can transform this optimization into the Binary Linear Program (BLP) shown in FIG. 7 of the drawings.

This program has 2m(n+1)k binary variables and mn(3+2m)+2mk constraints. The resultant optimized matrices $X'_r$ will then be used to construct the transformed $\Gamma$:

$$\Gamma' = \sum_{r=1}^{k} x_r X'_r \qquad (8)$$

Such a BLP subject to the constraints (3), (4) and (5) can be performed by commercially-available mathematical optimizing software. One example of such software is that sold as the ILOG CPLEX Optimizer version 9.0.0 by IBM Corporation, 1 New Orchard Road, Armonk, N.Y. 10504-1722, United States of America.

An integrated circuit can then be manufactured using well-known methods and equipment from the layout design thus generated by the optimisation process. However further and significant improvements can be obtained by continuing further with Part II of the method as will now be described.

Part II of the Method

Part I of the method was not concerned with any of the signs $s_{i,r}$ of the operands. We need to perform the updating of the signs, given the transformation in Part I, and proceed with the FIG. 2 to FIG. 5 transformation, by removing negative terms and replacing them by positive ones. This function is described above in the section headed Brief summary. This can be automated in the following way.

First we construct the n by m matrix S of signs:

$$S = \begin{pmatrix} s_{0,0} & s_{0,1} & \cdots & s_{0,m-1} \\ s_{1,0} & s_{1,1} & \cdots & s_{1,m-1} \\ \vdots & \vdots & \ddots & \vdots \\ s_{n-1,0} & s_{n-1,1} & \cdots & s_{n-1,m-1} \end{pmatrix}$$

We now need to extract the necessary information from $X_r$ and $X_r'$ in order to produce the transformed sign matrix S'. For practical purposes S' can be trivially created by inspecting the non-zero terms in the corresponding rows of $X_r$ and $X_r'$. However, for completeness, we present the matrix formulation:

$$P_r = X_r(I_m \otimes 1_{2,1}) \qquad (9)$$

$$P'_r = X'_r(I_m \otimes 1_{2,1})$$

$$e_i^T S' \stackrel{\text{def}}{=} e_i^T S \left( \bigcup_r ((e_i^T P_r)^T \otimes (e_i^T P'_r)) \right)$$

where in this case the x-in-a-circle sign $\otimes$ indicates the Kronecker product of matrices. $P_r$ and $P_r'$ are n by m matrices that contain the locations where the products within the SOPs have been moved. The expression in (9) that is a union over matrices is a permutation matrix, so (9) states that the ith row of S' is a permutation of the ith row of S. Having constructed S', we have now reached the point of constructing the transformation resulting in FIG. 2. In this case the transformation to S' is:

$$S = \begin{pmatrix} 0 & 0 \\ 0 & 1 \\ 0 & 1 \\ 1 & 1 \end{pmatrix} \Rightarrow S' = \begin{pmatrix} 0 & 0 \\ 0 & 1 \\ 1 & 0 \\ 1 & 1 \end{pmatrix} \qquad (10)$$

The first matrix S can be seen for our illustrative example to come directly from FIG. 1, and the second matrix S' follows from the rearrangement defined by (6) above and FIGS. 4-5. We now look at the sign of the first product and use the identity $-x = \overline{x-1}$ to guarantee that this will only ever be positive. In our illustrative example, this means that we look at the first product term Ab and make this always positive.

To simplify the implementation we can now split up the matrix S' into two matrices; an n by 1 vector GS as the global signs (these are the signs of the first product, viz. Ab) and an n by m matrix LS as the local signs (signs of the products taking into account the global signs):

$$GS = S'e_1$$

$$(LS)_{i,j} = (S')_{i,j} \oplus (S')_{i,0} \qquad (11)$$

So for the example of the illustrative SOPs of FIGS. 1-6:

$$S' = \begin{pmatrix} 0 & 0 \\ 0 & 1 \\ 1 & 0 \\ 1 & 1 \end{pmatrix} \Rightarrow GS = \begin{pmatrix} 0 \\ 0 \\ 1 \\ 1 \end{pmatrix} \quad LS = \begin{pmatrix} 0 & 0 \\ 0 & 1 \\ 0 & 1 \\ 0 & 0 \end{pmatrix} \qquad (12)$$

In summary, therefore, the steps of the preferred method so far are:
1. Construct the binary matrices $X_r$ for the individual operands such as in equation (2)
2. Solve the BLP found in FIG. 7 producing the optimized $X_r'$
3. Construct the sign matrix S and then using $X_r$ and $X_r'$ compute S' according to (9)
4. Construct GS and LS from (11)
5. Construct $\Gamma'$ according to (8)

Part III of the Method

We are now in a position to use these results in conjunction with the intended function set out at the beginning of the description of the Detailed Method in conjunction with FIG. 1 to state the result of the design method, the gamma matrix $\Gamma'$ coming from FIG. 7 and equation (8) in each case:

$$a_r = mux(\Gamma' e_{2r}, sel) \quad r \in \{0, 1, \ldots, m-1\} \qquad (13)$$

$$b_r = mux(\Gamma' e_{2r+1}, sel) \quad r \in \{0, 1, \ldots, m-1\}$$

$$y = \left( \left( \sum_{r=0}^{m-1} b_r(a_r \oplus mux(LSe_r, sel)) + b_r mux(LSe_r, sel) \right) - \right.$$

$$\left. mux(GS, sel) \right) \oplus mux(GS, sel)$$

Recall that $a_r \oplus mux(LSe_r, sel)$ results in a signed number, one bit larger than the size of $a_r$. . . . . Applying this to the example SOPs, combining (2), (6), (10) and (12) gives:

$$a_1 = mux((a, c, a, c), sel)$$

$$a_2 = mux((c, a, c, a), sel)$$

$$b_1 = mux((b, b, b, b), sel)$$

$$b_2 = mux((1, 1, 1, 1), sel)$$

$$y = \begin{pmatrix} b_1(a_1 \otimes mux((0, 0, 0, 0), sel)) + b_1 mux((0, 0, 0, 0), sel) + \\ b_2(a_2 \otimes mux((0, 1, 1, 0), sel)) + b_2 mux((0, 1, 1, 0), sel) - \\ mux((0, 0, 1, 1), sel) \end{pmatrix} \otimes$$

$$mux((0, 0, 1, 1), sel)$$

Standard synthesis tools will reduce this to:

$$a_1 = sel[0]?c:a$$

$$a_2 = sel[0]?a:c$$

$$y = (a_1 b + (a_2 \oplus (sel[1] \oplus sel[0])) + (sel[1] \oplus sel[0]) - sel[1]) \oplus sel[1]$$

which is identical in structure to FIG. 6.

Having, with the help of (13), obtained a formulation of the multiple input SOPs into a single SOP, that single equivalent SOP can now be turned into hardware using conventional equipment and methods for the manufacture of integrated circuits. In this way a single SOP is obtained which may occupy less integrated circuit area than would be occupied by the multiple input SOPs. Some specific instances are given below in the section 'Examples of SOPs'.

Alternative Implementations

As noted above, the foregoing description has assumed the following simplifying assumptions:
A) Each SOP has the same number of terms.
B) Operands are unsigned, non-constant and of identical word length.
C) Operands within each of the mutually-exclusive SOPs are all distinct.

Considering the relaxation of each of these in turn:
A) SOPs with differing numbers of terms: Simply introduce two new symbols into the alphabet: a zero symbol '0' and a don't care 'X' and use 0*X for all missing products. Given that 'X's do not contribute to muxing cost they do not need an associated variable vector $v_r$ during the BLP.
B) Variable word length, signed, unsigned or constant operands: Given input sizes for each of the operands, it makes sense to calculate which SOP all the SOPs will fit into. To do this, within each product order the operands in size from left to right, then within each SOP order the product terms from left to right in terms of the size of the first operand within each product. Taking the maximum across all SOPs for each $a_r$ and $b_r$ term will produce this 'superset' SOP. This will be the size of the SOP in the optimized code.

Making sure that the result of the BLP will fit into this superset SOP is simply a matter of forcing elements within $(X_r)_{i,j}$ to 0 in the case when the rth element of the alphabet will not fit into the jth position within the superset SOP. Making the first product within the optimized SOP never optionally negative, reduces hardware consumption as this is the largest product, optional negation of which will be more expensive than optional negation of any of the other products. Muxing between signed and unsigned operands simply requires converting the unsigned operand to signed, by sign-extending with 0. In equation (1) we performed the transformation:

$$a_r b_r (-1)^{\hat{}} g3_r(sel) = b_r (a_r \oplus g3_r(sel)) + b_r g3_r(sel)$$

At the time we had no reason to choose $a_r$ over $b_r$ when choosing the operand to negate. Now however it makes sense to force $b_r$ to be the smaller in bit width as this minimizes the size of the extra addition. This is already achieved if the superset SOP is constructed as above. Trivial constants such as 1 and 0 which will be treated as 1-bit operands will automatically be treated correctly once the superset SOP structure above is used.

C) SOPs with non-distinct (i.e. repeated) operands: A simple example of such an SOP would be ab+ac. In this case introduce new symbols into the alphabet for each duplicated version of the operand, but use the same variable $v_r$ for resultant symbols, as the muxing cost is the same for all of the 'new' symbols.

One trivial optimization worth noting is that, without loss of generality, the first row of $\Gamma'$ need not differ from $\Gamma$; this reduces the problem to requiring 2 nm k binary variables.

The optimisation problem of FIG. 6 and stated in FIG. 7 is preferably and conveniently solved as a Binary Linear Program, but may be phrased in alternative ways.

Examples of SOPs

The following examples of mutually-exclusive SOPs y have been evaluated in accordance with the method described above. The first, namely $y_1$, is as shown in FIG. 1.

$$y_1 = \begin{matrix} (s = 0)? & ab + c: & A = s[0]?c:a \\ (s = 1)? & bc - a: & B = b \\ (s = 2)? & c - ab: & C = (s[0]?a:c) \oplus (s[1] \oplus s[0]) \\ & -a - bc & y_1' = (AB + C + s[1] \& s[0] - s[1]) \oplus s[1] \end{matrix}$$

$$y_2 = (s = 0)?ab: -ab \quad y_2' = (ab - s) \oplus s$$

$$y_3 = \begin{matrix} (s = 0)? & ab: \\ (s = 1)? & cd + e: \\ (s = 2)? & f + g: \\ & h - k \end{matrix}$$

$$A = (s = 0)?a:(s = 1)?c:(s = 2)?f:h$$

$$B = (s = 0)?b:(s = 1)?d:1$$

$$C = (s = 0)?0:(s = 1)?e:(s = 2)?g:k$$

$$y_3' = AB + C \oplus (s[1] \& s[0]) + (s[1] \& s[0])$$

$$y_4 = \begin{matrix} (s = 0)? & ab: \\ (s = 1)? & ab + e: \\ (s = 2)? & a + b: \\ & a - b \end{matrix}$$

$$B = s[1]?1:b$$

$$C = (s = 0)?0:(s = 1)?e:b$$

$$y_4' = aB + C \oplus (s[1] \& s[0]) + (s[1] \& s[0])$$

$$y_5 = \begin{matrix} (s = 0)? & ab: \\ (s = 1)? & -ab: \\ (s = 2)? & c: \\ (s = 3)? & -c: \\ (s = 4)? & ab + c: \\ (s = 5)? & ab - c: \\ (s = 6)? & -ab + c: \\ & -ab - c \end{matrix}$$

-continued $$A = (s = 2 \| s = 3)?x{:}a$$
$$B = (s = 2 \| s = 3)?0{:}b$$
$$C = (s = 0 \| s = 1)?0{:}c$$
$$ls = (s = 3 \| s = 5 \| s = 6)?1{:}0$$
$$gs = (s = 1 \| s = 6 \| s = 7)?1{:}0$$
$$y'_5 = (AB + C \oplus ls + ls - gs) \oplus gs$$

$$y_6 = \begin{cases} (s = 0)? & ab + cd + ef + gh: \\ (s = 1)? & bc + de + fg + ha: \\ (s = 2)? & cd + ef + gh + ab: \\ (s = 3)? & de + fg + ha + bc: \\ (s = 4)? & ef + gh + ab + cd: \\ (s = 5)? & fg + ha + bc + de: \\ (s = 6)? & gh + ab + cd + ef: \\ & ha + bc + de + fg \end{cases}$$

$$A = s[0]?c{:}a$$
$$C = s[0]?e{:}c$$
$$E = s[0]?g{:}e$$
$$G = s[0]?a{:}g$$
$$y'_6 = Ab + Cd + Ef + Gh$$
$$y_7 = (s = 0)? \quad ab + c : b + d$$
$$A = s?1{:}a$$
$$C = s?d{:}c$$
$$y'_7 = Ab + C$$

Not all of these SOPs will produce significant benefits by use of the method, but where it does produce benefits they could be substantial. In particular computer simulations indicate that the benefits obtained with $y_1$, $y_2$, $y_3$ and $y_5$ could be in the range of a reduction of 47 to 57% in the area of integrated circuit required to implement the SOP.

The invention claimed is:

1. A method of manufacturing a hardware circuit component for executing multiple sum-of-products operations, characterised by the steps of:
  receiving a set of multiplexed sum-of-products functions of a plurality of operands, any one of which functions can be selected in dependence upon a select value by multiplex operations;
  re-arranging the sum-of-products functions;
  merging the rearranged set of sum-of-products functions into a single merged sum-of-products function containing one or more multiplexing operations;
  generating a layout design in dependence upon the single merged sum-of-products function; and
  manufacturing a hardware circuit component from the layout design; and
  in which the step of re-arranging the multiple sum-of-products functions comprises aligning the elements of the set of sum-of-products functions in such a manner that the amount of multiplexing in the single merged sum-of-products function is less than in the input set of sum-of-products functions.

2. The method according to claim 1, in which the rearranging step comprises the step of lining up at least one of the operands such as to be in the same position in a plurality of the sum-of-products functions of the received set of multiplexed sum-of-products functions.

3. The method according to claim 1, in which the rearranging step comprises the step of rendering the number of operands in each term of the sum-of-products substantially uniform.

4. The method according to claim 1, in which the rearranging step comprises the step of adding one or more additional variables such that each term of each sum-of-products contains the same number of products.

5. The method according to claim 1, in which the rearranging step includes the step of decomposing the received sum-of-products functions into k binary matrices where k is the number of operands, each matrix having a one to indicate the presence of an operand and a zero to indicate its absence.

6. The method according to claim 1,
  in which the rearranging and merging steps are optimised by a binary linear program.

7. The method according to claim 1, in which the merging step includes the step of replacing some or all negative terms in the sum-of-products functions by positive terms.

8. The method according to claim 7, in which operands of the form $-x$ are replaced with $\overline{x}+1$ or with $\overline{x-1}$.

9. The method according to claim 7, in which the merging step includes generating a sign matrix S, and transforming the sign matrix S into a transformed sign matrix S' to reflect the changes made in the rearrangement step.

10. A method of generating a layout design for use in the manufacture of a hardware circuit component for executing multiple sum-of-products operations, characterised by the steps of:
  receiving a set of multiplexed sum-of-products functions of a plurality of operands, any one of which functions can be selected in dependence upon a select value (ccl) by multiplex operations;
  re-arranging the sum-of-products functions;
  merging the rearranged set of sum-of-products functions into a single merged sum-of-products function containing one or more multiplexing operations; and
  generating a layout design in dependence upon the single merged sum-of-products function; and
  in which the step of re-arranging the multiple sum-of-products functions comprises aligning the elements of the set of sum-of-products functions in such a manner that the amount of multiplexing in the single merged sum-of-products function is less than in the input set of sum-of-products functions.

* * * * *